United States Patent
Wen

[19]

[11] Patent Number: 5,946,576
[45] Date of Patent: Aug. 31, 1999

[54] METHOD OF FABRICATING A SEMICONDUCTOR READY-ONLY MEMORY DEVICE USED FOR PERMANENT STORAGE OF MULTI-LEVEL CODED DATA

[75] Inventor: Jemmy Wen, Hsinchu, Taiwan

[73] Assignee: United Microelectronics Corp., Taiwan

[21] Appl. No.: 08/993,866

[22] Filed: Dec. 18, 1997

[30] Foreign Application Priority Data

Oct. 29, 1997 [TW] Taiwan ................................ 86116024

[51] Int. Cl.⁶ ............................................. H01L 21/8246
[52] U.S. Cl. ........................................ 438/278; 438/130
[58] Field of Search ................................. 438/130, 275, 438/276, 277, 278, 588

[56] References Cited

U.S. PATENT DOCUMENTS

| | | | |
|---|---|---|---|
| 4,356,042 | 10/1982 | Gedaly et al. | 438/278 |
| 4,365,405 | 12/1982 | Dickman et al. | 438/278 |
| 5,429,967 | 7/1995 | Hong | 438/278 |
| 5,585,297 | 12/1996 | Sheng et al. | 438/278 |

*Primary Examiner*—Chandra Chaudhari
*Attorney, Agent, or Firm*—Rabin & Champagne, P.C.

[57] ABSTRACT

A method is provided for fabricating a ROM device for permanent storage of multi-level coded data therein. By the method, an array of MOSFET-based memory cells are first formed on a substrate, each being formed with an island-like gate region and a pair of source/drain regions. In accordance with customer specification, different groups of the memory cells are specified to respectively store a first, a second, a third, and a fourth value of the multi-level coded data. In the mask programming process, a first code-implantation process is performed to implant impurities into the respective channel regions of the second and fourth selected groups of the memory cells so as to vary the threshold voltage thereof. Then, an insulating layer is formed over the wafer, covering all of the memory cells. Next, a second code-implantation process is performed to form a plurality of contact windows in the insulating layer directly above the island-like gates of the first and second selected groups of the memory cells. Then, a conductive layer is deposited over the insulating layer, which fills up all of the contact windows in the insulating layer and is then selectively removed to form a plurality of word lines. This allows the four groups of memory cells to be set to various threshold voltage levels representing the permanent storage of various values of the multi-level coded data.

8 Claims, 7 Drawing Sheets es,576

METHOD OF FABRICATING A SEMICONDUCTOR READY-ONLY MEMORY DEVICE USED FOR PERMANENT STORAGE OF MULTI-LEVEL CODED DATA

BACKGROUND OF THE INVENTION

1. Field of the Invention

This invention relates to semiconductor fabrication processes, and more particularly, to a method for fabricating a semiconductor read-only memory (ROM) device which is used for permanent storage of multi-level coded data therein.

2. Description of Related Art

Read-only memory (ROM) is a nonvolatile semiconductor memory widely used in computer and microprocessor systems for permanently storing information including programs and data that will be repeatedly used. The manufacture of ROMs involves very complicated and time-consuming processes and requires costly equipment and material to achieve. Therefore, the data that are to be permanently stored in ROMs are first defined by the customer and then furnished to the factory to be programmed into the ROMs.

Most ROMs are identical in semiconductor structure except for the different values of data stored therein. Therefore, the ROM devices can be fabricated up to the stage ready for data programming and then the semi-finished products are stocked in inventories waiting for customer orders. The customer then furnishes the data to the factory where the data are stored into the semi-finished ROMs by using, the so-called mask programming process. This procedure is presently a standard method in the semiconductor industry for fabricating the ROMs.

Conventional ROMs are usually based on metal-oxide semiconductor field-effect transistor (MOSFET) memory cells, each memory cell being used for the storage of one value of the binary-coded data. In the mask programming process, these MOSFET-based memory cells are selectively doped with impurities into the associated channel regions so as to vary the threshold voltage thereof. This can set a first selected group of the memory cells to a permanently-ON state representing the permanent storage of a first value of the binary-coded data, for example 0, and a second selected group of the memory cells to a permanently-OFF state representing the permanent storage of a second value of the binary-coded data, for example 1.

FIG. 1 shows a schematic top view of a conventional MOSFET-based ROM device which is specifically designed for permanent storage of binary-coded data therein. This ROM device includes a plurality of memory cells as exemplarily indicated by the dashed boxes labeled with the reference numerals 100, 101, and 102, which can be accessed via a plurality of intercrossed word lines WL and bit lines BL. Each of the memory cells is associated with one segment of the word line between each neighboring pair of the bit lines under which one channel region, as exemplarily indicated by the reference numeral 10, is formed. Whether the memory cell 100 stores the binary data 0 or 1 is dependent on whether its associated channel region 10 is doped with impurities or not.

The foregoing type of ROM device is specifically devised for permanent storage of binary-coded data which have two different values only. To allow for a larger capacity of data storage, the data can be represented by more than two values. For example, a ternary system handles the data by representing them in three different values, and a quaternary system handles the data by representing them in four different values. In general, such a system is referred to as an M-ary system for handling multi-level coded data represented by M different values (M>2). For permanent storage of the multi-level coded data, the memory cells of ROM device should be selectively set to M different threshold voltage levels which represent the M different values of the multi-level coded data. In fabricating such a ROM device, the so-called multiple code-implantation process is used to form the memory cells with various threshold voltage levels representing the permanent storage of different values of the multi-level coded data.

For instance, as shown in FIG. 2, in a ROM device for permanent storage of multi-level coded data, the channel regions of the MOSFET-based memory cells are doped in a different manner so as to provide a first threshold voltage $V_T$ representing the permanent storage of a first value of the multi-level coded data, a second threshold voltage $V_{T1}$ representing the permanent storage of a second value of the multi-level coded data, a third threshold voltage $V_{T2}$ representing the permanent storage of a third value of the multi-level coded data.

One major drawback to the foregoing ROM device, however, is that the multiple code-implantation process requires the ion-implantation process to be performed for several times in different conditions. The mask programming process is thus very time-consuming to carry out. The delivery period of the product of the ROM device is thus long, which makes the ROM device less competitive in the market.

SUMMARY OF THE INVENTION

It is therefore an objective of the present invention to provide a method for fabricating a multi-stage ROM device, which combines the step of forming contact windows and the step of the second mask programming process into one step, allowing the fabrication process to be simplified by eliminating the need to perform the code-implantation process for several times.

In accordance with the foregoing and other objectives of the present invention, a new method for fabricating a multi-stage ROM device is provided.

Broadly speaking, the method of the invention includes the following procedural steps of:

(1) preparing a semiconductor substrate of a first semiconductor type;

(2) forming a gate dielectric layer over the substrate, and then forming a polysilicon layer over the dielectric layer;

(3) removing selected portions of the polysilicon layer so as to expose those areas on the dielectric layer beneath which a plurality of bit lines are to be formed, the remaining portions of the polysilicon layer being parallel spaced;

(4) performing an ion-implantation process on the substrate using an impurity material of a second semiconductor type as the dopant so as to form a plurality of source/drain regions in the substrate serving as the bit lines;

(5) removing selected portions of the remaining portions of the polysilicon layer formed in said step (3) to thereby form an array of island-like gate regions therefrom, said island-like gate regions and their neighboring source/drain re-ions in combination constituting an array of memory cells for the ROM device, in which a first selected group of the memory cells are specified to store a first value of the multi-level coded data, a second selected group of the memory cells are specified to store a second value of the multi-level coded data, a third selected group of the memory cells are specified to store a third value of the multi-level coded data, and a fourth selected group of the memory cells are specified to store a fourth value of the multi-level coded data;

(6) performing a first code-implantation process so as to implant a dopant into the respective channel regions of the second and fourth selected groups of the memory cells so as to vary the threshold voltage thereof;

(7) forming an insulating layer covering all of the memory cells;

(8) performing a second code-implantation process in which those portions of the insulating layer that are located above the first and second selected groups of the memory cells are etched away until the gates of the first and second selected groups of the memory cells are exposed, the removed portions serving as a plurality of contact windows through the insulating layer; and (9) forming a conductive layer over the insulating layer, which fills up all of the contact windows in the insulating layer; and then removing selected portions of the conductive layer to form a plurality of word lines.

Through the foregoing process, the four groups of the memory cells can be set to various threshold voltage levels representing the permanent storage of various values of the multi-level coded data stored in the ROM device. It is an advantage of the method of the invention that the multi-level coded data can to be permanently programmed into the ROM device through only two different code-implantation processes. The overall process is thus simplified compared to the prior art.

BRIEF DESCRIPTION OF DRAWINGS

The invention can be more fully understood by reading the following detailed description of the preferred embodiments, with reference made to the accompanying drawings wherein.

DETAILED DESCRIPTION OF PREFERRED EMBODIMENTS

A preferred embodiment of the method according to the invention is disclosed in full detail in the following with reference to FIGS. 3A through 3F and FIGS. 4A and 4B.

Figure 1:
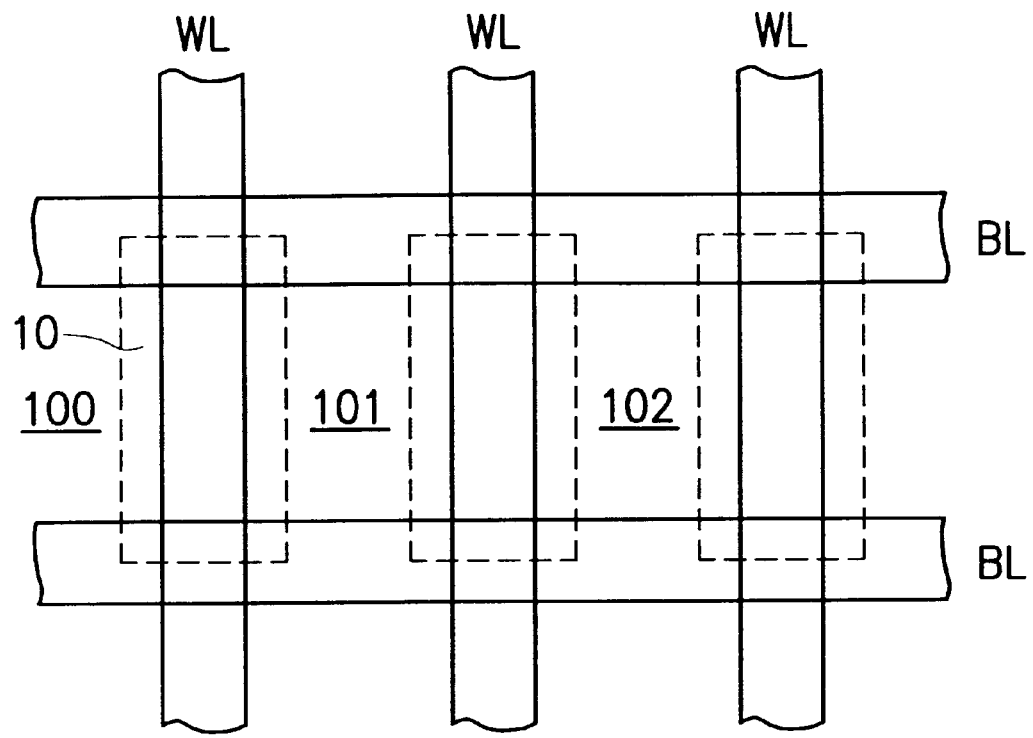
FIG. 1 is a schematic top view of a conventional ROM device which is devised for permanent storage of binary-coded data therein.
Figure 2:
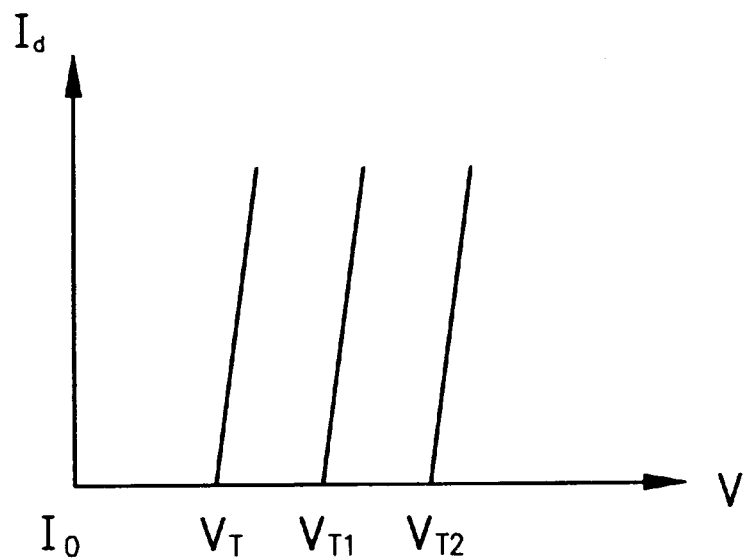
FIG. 2 is a graph, showing the drain current ($I_d$) versus applied voltage (V) for various memory cells set to different threshold voltage levels $V_T$, $V_{T1}$, $V_{T2}$ in a conventional ROM device used for permanent storage of multi-level coded data.
Figure 3A:
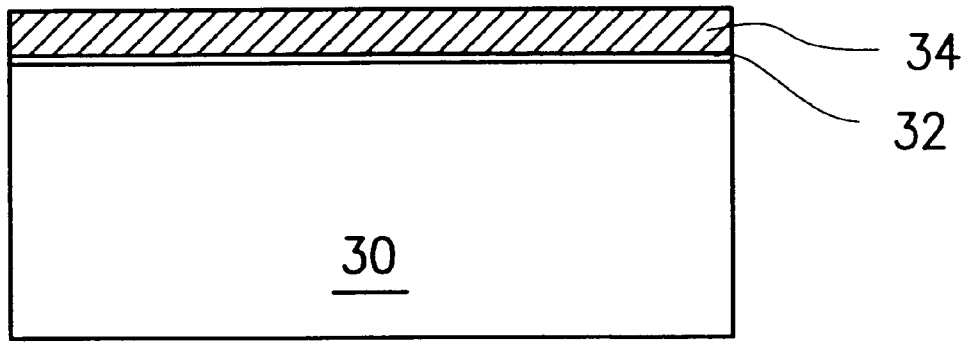
FIGS. 3A through 3F are schematic sectional diagrams used to depict the steps involved in the method of the invention for fabricating a ROM device used for permanent storage of multi-level coded data.

Referring to FIG. 3A, in the first step of the method, a semiconductor substrate 30, such as a P-type silicon substrate, is prepared. Next, a gate dielectric layer 32, such as a layer of silicon dioxide ($SiO_2$), is formed over the substrate 30; and then a polysilicon layer 34 is deposited over the dielectric layer 32.

Figure 3B:
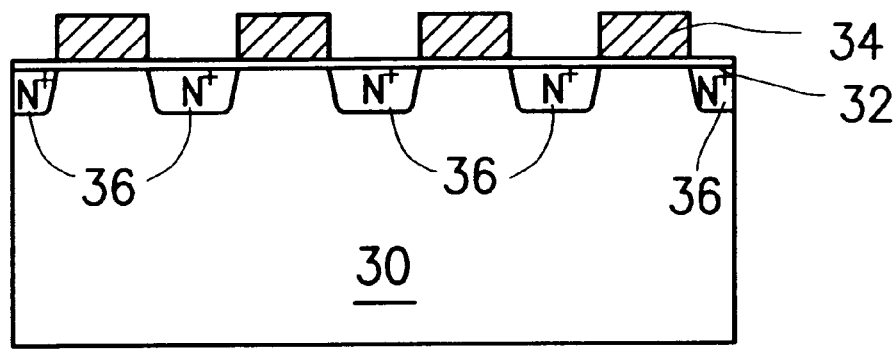
Figure 4A:
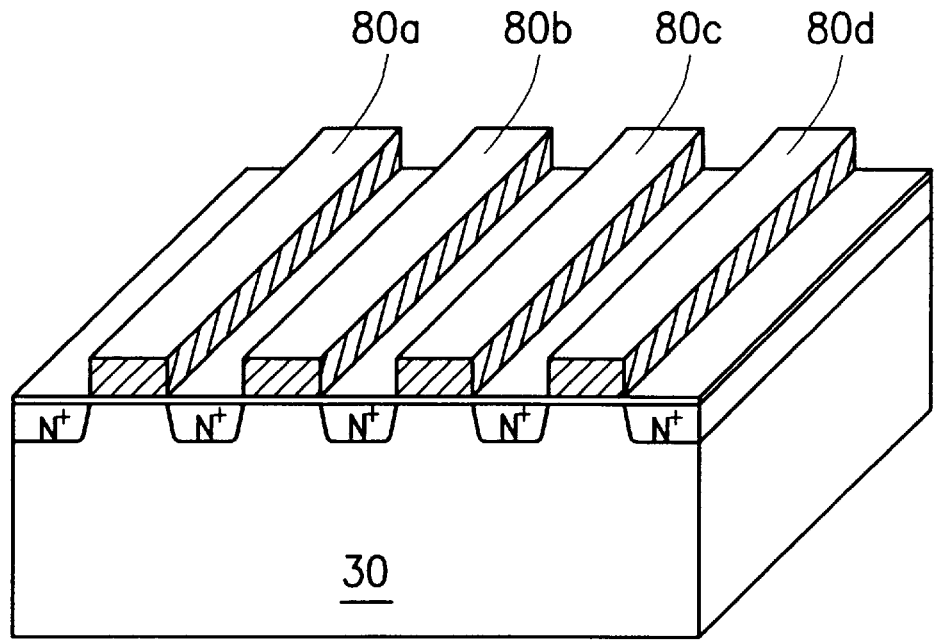
FIGS. 4A and 4B are two schematic perspective views of the ROM device shown in FIGS. 3A through 3F.

Referring next to FIG. 3B together with FIG. 4A, in the subsequent step, a photolithographic and etching process is performed on the polysilicon layer 34 for selective removal of the polysilicon layer 34 to thereby expose those portions of the substrate 30 where a plurality of bit lines are to be formed. As illustrated in FIG. 4A, the remaining portions of the polysilicon layer 34, as designated by the reference numerals 80a, 80b, 80c, 80d, are parallel-spaced. Subsequently, a self-aligning ion-implantation process is performed on the wafer so as to implant an N-type dopant, such as phosphor ions, into those portions of the substrate 30 that are uncovered by the polysilicon layer 34, whereby a plurality of parallel-spaced $N^+$source/drain regions 36 are formed in the substrate 30 between the polysilicon layers 80a, 80b, 80c, 80d, which serve as a plurality of bit lines for the ROM device.

Figure 3C:
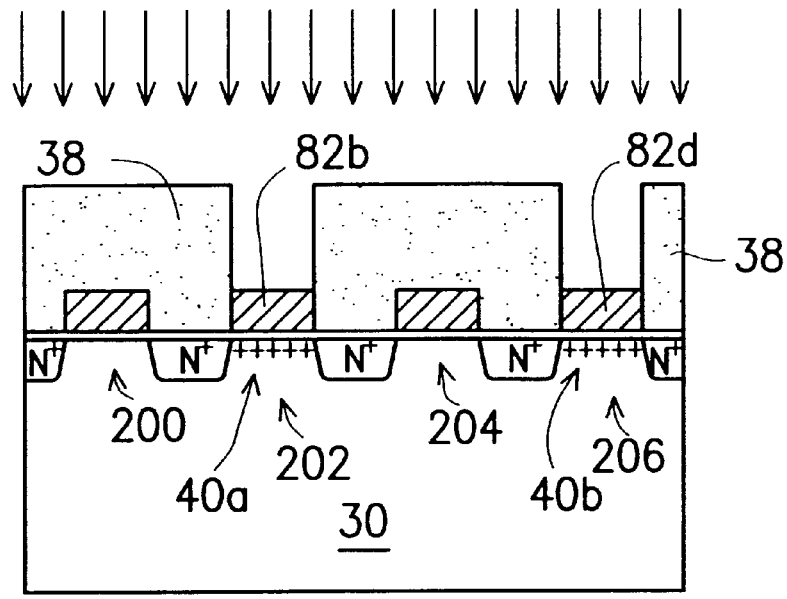
Figure 4B:
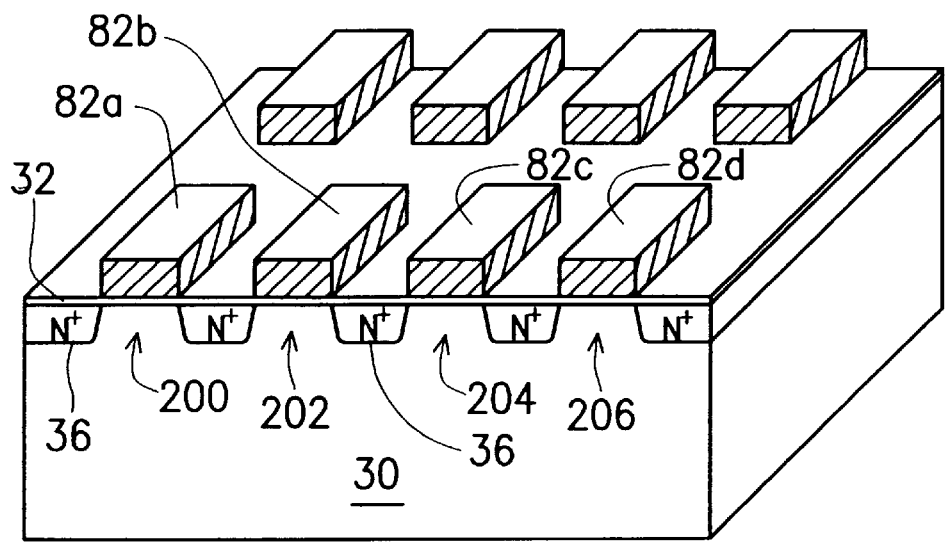

Referring next to FIG. 3C together with FIG. 4B, a selective etching process is then performed on the polysilicon layers 80a, 80b, 80c, 80d so as to remove selected portions thereof, whereby an array of island-like gates as those designated by the reference numerals 82a, 82b, 82c, 82d (see FIG. 4B) are formed, which are associated with the neighboring source/drain regions 36 to constitute an array of MOSFET-based memory cells. In the case of FIG. 3C and FIG. 4B, for example, the island-like gate 82a and the neighboring pair of the source/drain regions 36 in combination constitute a first memory cell 200; the island-like gate 82b and the neighboring pair of the source/drain regions 36 in combination constitute a second memory cell 202, the island-like gate 82c and the neighboring pair of the source/drain regions 36 in combination constitute a third memory cell 204; and the island-like gate 82d and the neighboring pair of the source/drain regions 36 in combination constitute a fourth memory cell 206. In the ensuing steps, it will be assumed that the first memory cell 200 is to be set to have a first threshold voltage level representing the permanent storage of a first value of multi-level coded data therein; the second memory cell 202 is to be set to have a second threshold voltage level representing the permanent storage of a second value of multi-level coded data therein; the third memory cell 204 is to be set to have a third threshold voltage level representing the permanent storage of a third value of multi-level coded data therein; and the fourth memory cell 206 is to be set to have a fourth threshold voltage level representing the permanent storage of a fourth value of multi-level coded data therein. In accordance the invention, this requires only two code-implantation processes as will be described in the following.

In the first code-implantation process, a photoresist layer 38 is deposited over the entire top surface of the wafer, which is then selectively removed to expose the island-like gates 82b, 82d while covering the island-like gates 82a, 82c. An ion-implantation process is then performed on the wafer so as to implant a dopant, such as P-type boron ions, into the channel regions 40a, 40b beneath the island-like gates 82b, 82d, as illustrated in FIG. 3C. This allows the channel regions 40a, 40b of the memory cells 202, 206 to be varied in its threshold voltage other than that of the memory cells 200, 204. After this, the photoresist layer 38 is removed. This completes the first code-implantation process.

Figure 3D:
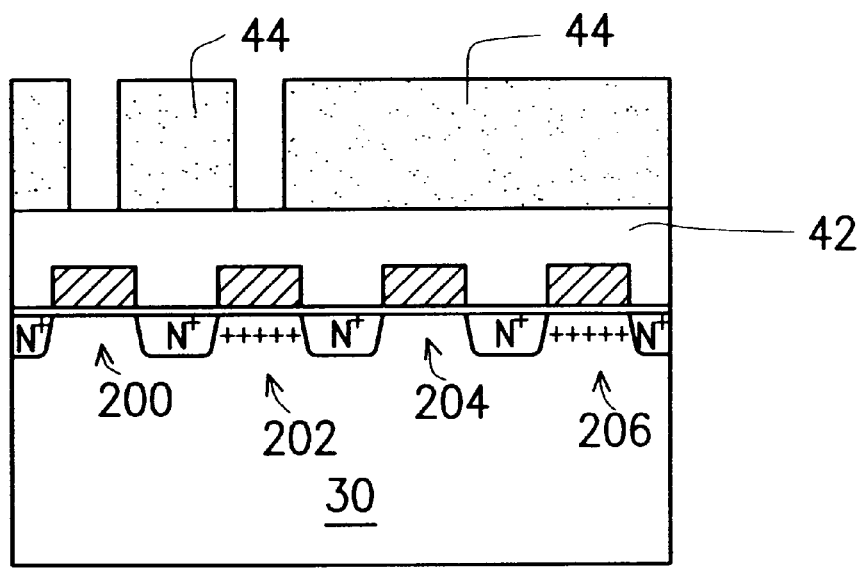

Referring further to FIG. 3D, the second code-implantation process will be performed subsequently. In the second code-implantation process, an insulating layer 42, such as an oxide layer, is first formed over the entire top surface of the wafer, covering all of the memory cells 200, 202, 204, 206. Next, a photoresist layer 44 is deposited over the insulating layer 42, which is selectively removed to expose those areas on the insulating layer 42 that are located directly above the island-like gates 82a, 82b associated respectively with the memory cells 200, 202.

Figure 3E:
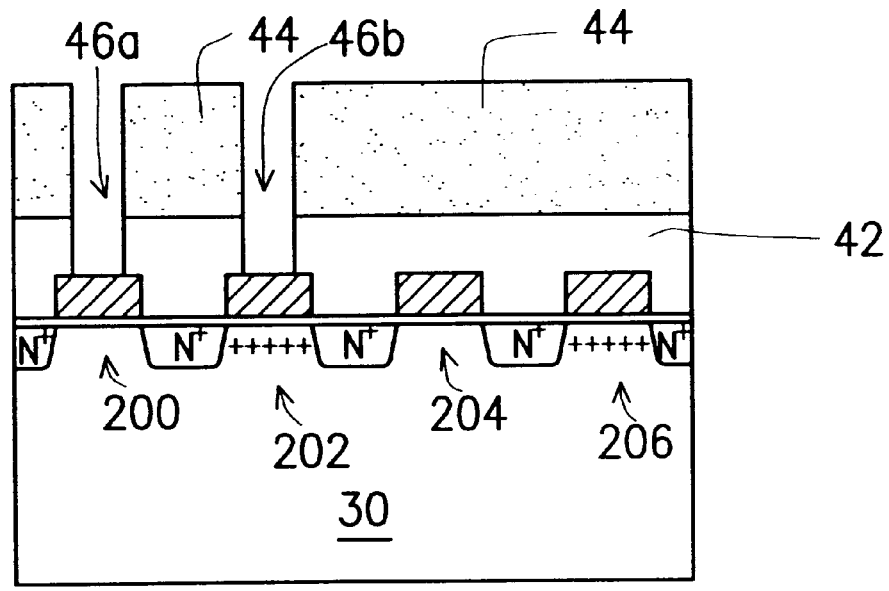

Referring next to FIG. 3E, in the subsequent step, an etching process with the top surface of the island-like gates 82a, 82b as etch end point is performed on the wafer so as to remove the exposed portions of the insulating layer 42 located directly above the island-like gates 82a, 82b. As a result of this process, a first contact window 46a is formed in the insulating layer 42 which exposes the island-like grate 82a; and a second contact window 46b is formed in the insulating layer 42 which exposes the island-like gate 82b.

Figure 3F:
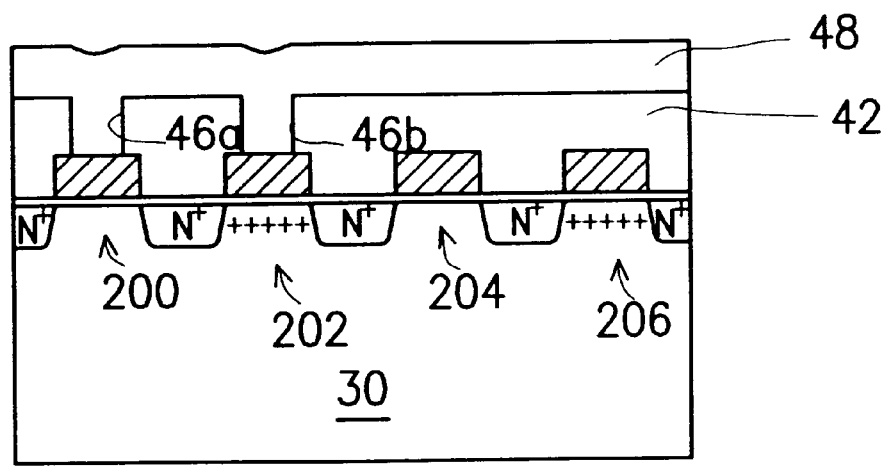

Referring to FIG. 3F, the photoresist layer 44 is then removed. Next, a conductive layer 48, such as a metallization layer, is deposited over the entire top surface of the wafer, which fills up all of the contact windows 46a, 46b. The conductive layer 48 is then selectively removed to form a plurality of parallel-spaced word lines 49. This complete the second code-implantation process.

Figure 5:
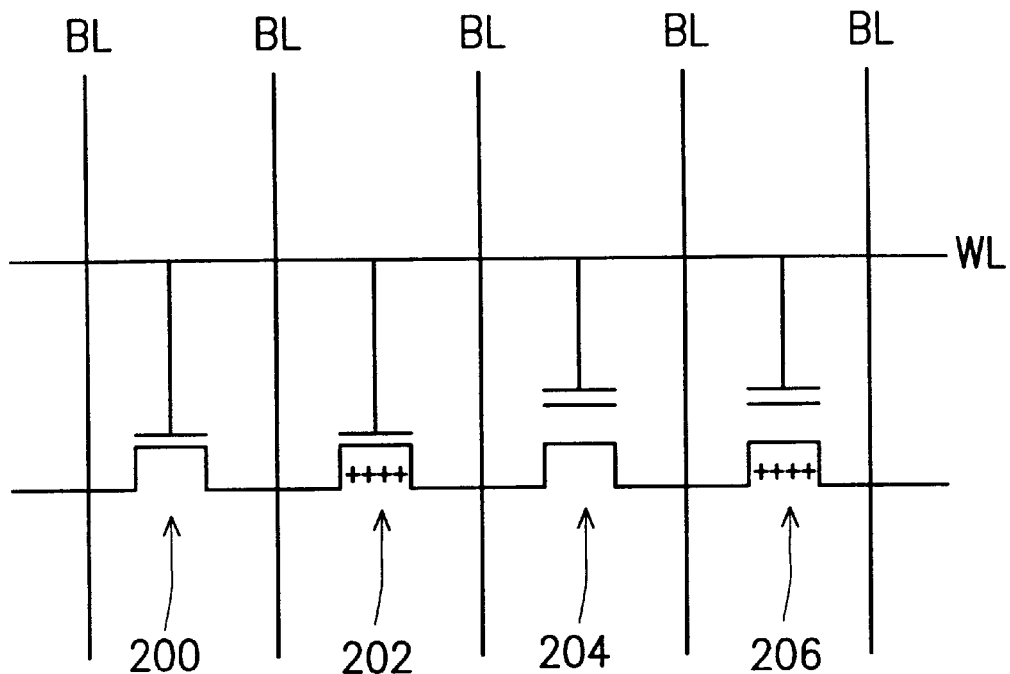
FIG. 5 is a schematic circuit diagram of the finished ROM device of FIG. 3F.
Figure 7:
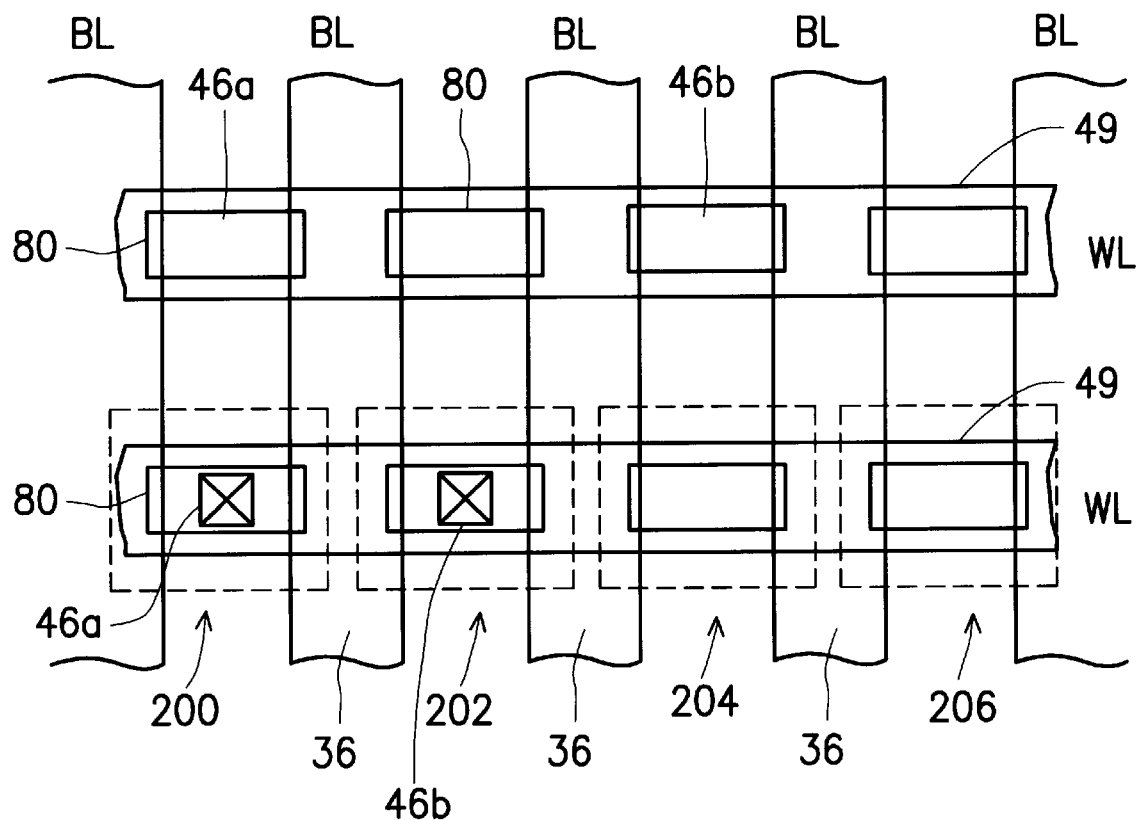
FIG. 7 is a schematic top view of the finished ROM device of FIG. 3F.

FIG. 7 is a schematic top view of the finished ROM device of FIG. 3F; and FIG. 5 is a schematic circuit diagram of the same. As shown, the data stored in the four memory cells 200, 202, 204, 206 can be accessed via the word lines WL and the bit lines BL. In FIG. 7, the memory cells (i.e., 200, 202) that are marked with a crossed square box are those memory cells that are formed with a contact window in the second code-implantation process.

Figure 6:
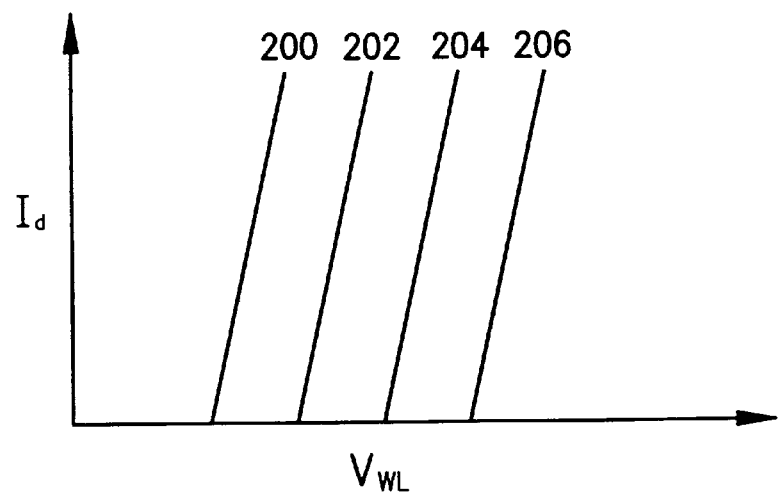
FIG. 6 is a graph, showing the drain current ($I_d$) versus applied voltage (V) for various memory cells in the ROM device of FIG. 5.

Through the foregoing steps, the memory cells 200, 202, 204, 206 are respectively set to have various threshold voltage levels as illustrated in the graph of FIG. 6. As shown, the first memory cell 200 has the lowest threshold voltage level since its channel region is undoped with impurities in the first code-implantation process and its gate is connected via a contact window in the insulating layer 42 to the conductive layer 48 in the second code-implantation process; the second memory cell 202 has the second lowest threshold voltage level since its channel region is doped with impurities in the first code-implantation process and its gate is connected via a contact window in the insulating layer 42 to the conductive layer 48 in the second code-implantation process; the third memory cell 204 has the second largest threshold voltage level since its channel region is undoped with impurities in the first code-implantation process and its gate is isolated from the conductive layer 48 in the second code-implantation process; and the fourth memory cell 206 has the largest threshold voltage level since its channel region is doped with impurities and its gate is isolated from the conductive layer 48 in the second code-implantation process. This allows the four memory cells 200, 202, 204, 206 to be set to various threshold voltage levels representing the permanent storage of various values of the multi-level coded data stored in the ROM device.

In conclusion, the method of the invention uses the first mask programming process and the second mask programming process to program data into each of the memory cells based on the independent island-like gates. Since the forming of the metal lines and the forming of the contact windows are combined into one step, the overall manufacturing process is simplified so that the delivery period of the ROM products to the customer can be shortened.

In the foregoing preferred embodiment of the invention, the substrate is a P-type silicon substrate. However, within the spirit and scope of the invention, the substrate can be alternatively an N-type silicon substrate; in this case, the dopant implanted into the source/drain regions is changed from N-type to P-type. The dopant implanted into the channel regions to vary the threshold voltage thereof can be either N-type or P-type.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a ROM device used for permanent storage of a set of multi-level coded data therein, comprising the steps of:

(1) preparing a semiconductor substrate of a first semiconductor type;

(2) forming a gate dielectric layer over the substrate, and then forming a polysilicon layer over the dielectric layer;

(3) removing selected portions of the polysilicon layer so as to expose those areas on the dielectric layer beneath which a plurality of bit lines are to be formed, the remaining portions of the polysilicon layer being parallel spaced;

(4) performing an ion-implantation process on the substrate using an impurity material of a second semiconductor type as the dopant so as to form a plurality of source/drain regions in the substrate serving as the bit lines;

(5) removing selected portions of the remaining portions of the polysilicon layer formed in said step (3) to thereby form an array of island-like gate regions therefrom, said island like gate regions and their neighboring source/drain regions in combination constituting an array of memory cells for the ROM device, in which
  a first selected group of the memory cells are specified to store a first value of the multi-level coded data,
  a second selected group of the memory cells are specified to store a second value of the multi-level coded data,
  a third selected group of the memory cells are specified to store a third value of the multi-level coded data, and
  a fourth selected group of the memory cells are specified to store a fourth value of the multi-level coded data;

(6) performing a first code-implantation process so as to implant a dopant into the respective channel regions of the second and fourth selected groups of the memory cells so as to vary the threshold voltage thereof;

(7) forming an insulating layer covering all of the memory cells;

(8) performing a second code-implantation process in which those portions of the insulating layer that are located above the first and second selected groups of the memory cells are etched away until the gates of the first and second selected groups of the memory cells are exposed, the removed portions serving as a plurality of contact windows through the insulating layer; and (9) forming a conductive layer over the insulating layer, which fills up all of the contact windows in the insulating layer; and then removing selected portions of the conductive layer to form a plurality of word lines.

2. The method of claim 1, wherein the first semiconductor type is P-type while the second semiconductor type is N-type.

3. The method of claim 1 wherein the first semiconductor type is N-type while the second semiconductor type is P-type.

4. The method of claim 1, wherein in said step (2), the dielectric layer is a gate oxide layer.

5. The method of claim 1, wherein in said step (6), the dopant is P-type ions.

6. The method of claim 1, wherein in said step (6), the dopant is N-type ions.

7. The method of claim 1, wherein in said step (7), the insulating layer is a layer of silicon oxide.

8. The method of claim 1, wherein in said step (9), the conductive layer is a metallization layer.

\* \* \* \* \*